US010754145B1

(12) United States Patent
Ouderkirk et al.

(10) Patent No.: US 10,754,145 B1
(45) Date of Patent: Aug. 25, 2020

(54) APPARATUSES, SYSTEMS, AND METHODS FOR ADJUSTING FLUID LENSES

(71) Applicant: Oculus VR, LLC, Menlo Park, CA (US)

(72) Inventors: Andrew J. Ouderkirk, Redmond, WA (US); Katherine Marie Smyth, Seattle, WA (US); John M. Cooke, Bothell, WA (US); Matthew James Hancock, Newton Highlands, MA (US); Karol Constantine Hatzilias, Kenmore, WA (US); Lu Lu, Kirkland, WA (US); Nagi H. Elabbasi, Farmingham, MA (US); Robin Sharma, Redmond, WA (US); Behnam Bastani, San Jose, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 264 days.

(21) Appl. No.: 16/008,635

(22) Filed: Jun. 14, 2018

Related U.S. Application Data

(60) Provisional application No. 62/646,900, filed on Mar. 22, 2018.

(51) Int. Cl.
*G02B 26/00* (2006.01)
*G02B 7/09* (2006.01)
*G02B 7/02* (2006.01)
*G02B 3/14* (2006.01)

(52) U.S. Cl.
CPC ............ *G02B 26/004* (2013.01); *G02B 3/14* (2013.01); *G02B 7/023* (2013.01); *G02B 7/09* (2013.01)

(58) Field of Classification Search
CPC ........ G02B 26/004; G02B 3/14; G02B 7/023; G02B 7/09
See application file for complete search history.

(56) References Cited

U.S. PATENT DOCUMENTS

2008/0170299 A1* 7/2008 Kawabata .............. H04N 5/217
359/665

OTHER PUBLICATIONS

Press Kit Home, "Adaptive glasses", accessed at http://tvc.utah.edu, as accessed on Mar. 13, 2018, 5 pages.
Billah et al., "Microstructure Evolution and Electrical Characterization of Lanthanum doped Barium Titanate (BaTi03) Ceramics", International Conference on Mechanical Engineering, AIP Conf. Proc. 1754, accessed on Jul. 12, 2016, pp. 030006-1-030006-7.
(Continued)

*Primary Examiner* — Wen Huang
(74) *Attorney, Agent, or Firm* — FisherBroyles, LLP

(57) ABSTRACT

An apparatus may include an adjustable fluid lens that includes a deformable element and a fluid that is substantially transparent and that is contained at least in part by the deformable element. The apparatus may additionally include a sensor that detects a property of the fluid that indicates a viscosity of the fluid. The apparatus may further include a control element that regulates, based at least in part on the property of the fluid, a speed with which to apply a deforming force to the deformable element. Additionally, the apparatus may include an actuator that adjusts an optical property of the adjustable fluid lens by applying the deforming force to the deformable element at the regulated speed. Various other apparatuses, systems, and methods are also disclosed.

20 Claims, 11 Drawing Sheets

(56) References Cited

OTHER PUBLICATIONS

Cao et al., "Grain Size and Domain Size Relations in Bulk Ceramic Ferroelectric Materials", J. Phys. Chem Solids vol. 57, No. 10, pp. 1499-1505, 1996.
Ding et al., "Surface profiling of an aspherical liquid lens with a varied thickness membrane," Optics Express, vol. 25, No. 4, pp. 3122-3132, accessed on Feb. 6, 2017.
He et al., "Linear Electro-Optic Properties of Orthorhombic PZN-8%PT Single Crystal", IEEE Transactions on Ultrasonics, Ferroelectrics, and Frequency Control, vol. 58, No. 6, Jun. 2011, pp. 1118-1121.
Knapp et al., "Understanding Zirconia Crown Esthetics and Optical Properties" Inclusive magazine accessed at http://glidewelldental.com/education/inclusive-dental-implant-magazine-volume-2-issue-4/, as accessed on Jun. 12, 2018, vol. 2, Issue 4, 17 pages.
Optotune, "Focus tunable lenses", accessed at http://www.optotune.com/technology/focus-tunable-lenses, accessed on Mar. 13, 2018, 2 pages.
Polight, "How does it work", accessed at http://www.polight.com/technology-and-products/how-does-it-work/default.aspx, accessed on Mar. 13, 2018, 3 pages.
"Uzoom Adlens, ""Adjustable Lens Glasses: How They Work"", accessed at https://adlens.com/how-it-works/, accessed on Mar. 28, 2018, 9 pages."
"Piezo Technology, ""Highly Reliable Multilayer Piezo Actuators"", accessed on https://www.piceramic.com/en/piezo-technology/picma/, accessed on Mar. 14, 2018, 8 pages."
"Piezo Technology, ""Displacement Modes of Piezoelectric Actuators"", accessed on https://www.piceramic.com/en/piezo-technology/properties-piezo-actuators/displacement-modes/, accessed on Mar. 14, 2018, 12 pages."
Jiang et al., "Transparent Electro-Optic Ceramics and Devices", Proceedings vol. 5644, Optoelectronic devices and integration, accessed at https://doi.org/10.1117/12.582105, Jan. 17, 2005, 15 Pages.
Keplinger et al., "Stretchable, Transparent, Ionic Conductors", Science Magazine, vol. 341, DOI:10.1126/science.1240228, Accessed on Aug. 30, 2013, pp. 984-987.
Kong et al., "Transparent Ceramic Materials", Transparent Ceramics, Topics in Mining, Metallurgy, and Materials Engineering, Ch. 2, DOI 10.1007/978-3-319-18956-7_2, Springer international Publishing Switzerland 2015, pp. 29-91.
Patra et al., "Comparison on Optical Properties of Pure and Doped Lithium Tetraborate Single Crystals and Glasses", Solid State Physics: Proceedings of the 56th DAE Solid State Physics Symposium 2011, AIP Conf. Proc. 1447, Dec. 11, 2012, pp. 1335-1336.
Riegler et al., "Index Matching Silicone for High Brightness LED Packaging", IMAPS International Conference on Device Packaging Mar. 13-16, Scottsdale AZ, Accessed on Mar. 18, 2005, 17 Pages.
Shian et al., "Tunable Lenses using Transparent Dielectric Elastomer Actuators", Optics Express, vol. 21, No. 7, accessed at https://doi.org/10.1364/OE.21.008669, accessed on Apr. 2, 2013, pp. 8669-8676.
"Hocking, L.M., ""The effect of slip on the motion of a sphere close to a wall and of two adjacent spheres, Journal of Engineering Math., vol. 7 (1973), pp. 207-221."
Wang et al., "A Highly Stretchable, Transparent, and Conductive Polymer", Science Advances vol. 3, No. 3, e1602076, Mar. 10, 2017, pp. 1-10.
APC International, Ltd., "Piezoelectric Materials, New Materials, Piezo theory", accessed at www.americanpiezo.com/knowledge-center/piezo-theory/new-materials/html, accessed on Mar. 15, 2018, 1 page.
Zhao et al., "Spherical aberration free liquid-filled tunable lens with variable thickness membrane," Optics Express vol. 23, No. 16, accessed at https://doi.org/10.1364/OE.23.021264, accessed on Aug. 5, 2015, pp. 21264-21278.

\* cited by examiner

APPARATUSES, SYSTEMS, AND METHODS FOR ADJUSTING FLUID LENSES

This application claims the benefit of U.S. Provisional Application No. 62/646,900, filed 22 Mar. 2018.

BACKGROUND

Fluid lenses are able to assume different optical properties by changing shape in response to forces applied to the lenses. A lens with an adjustable optical power may be useful for a variety of applications, whether in industrial, military, or medical contexts or for entertainment and leisure. When a deforming force is applied to a fluid lens, the fluid within the fluid lens may become perturbed, such that the shape of the fluid lens does not reach its equilibrium form until the perturbation dissipates. However, while the fluid lens is out of equilibrium, the image quality of the fluid lens may be poor, potentially interfering with uses of the fluid lens that rely on quick response times. Accordingly, the instant disclosure identifies and addresses a need for additional and improved apparatuses, systems, and methods for adjusting fluid lenses.

SUMMARY

As will be described in greater detail below, the instant disclosure describes systems and methods for adjusting fluid lenses by regulating the force applied to the fluid lens based on the viscosity of the fluid within the lens.

In some examples, an apparatus for adjusting fluid lenses may include an adjustable fluid lens that includes a deformable element and a fluid that is substantially transparent and that is contained at least in part by the deformable element. The apparatus may also include a sensor that detects a property of the fluid that indicates a viscosity of the fluid, a control element that regulates, based at least in part on the property of the fluid, a speed with which to apply a deforming force to the deformable element, and/or an actuator that adjusts an optical property of the adjustable fluid lens by applying the deforming force to the deformable element at the regulated speed.

In some examples, the sensor that detects the property of the fluid may detect a temperature of the fluid. In one example, the control element may regulate the speed according to a positive correlation with the temperature of the fluid.

In some embodiments, the actuator that adjusts the optical property of the adjustable fluid lens may adjust an optical power of the adjustable fluid lens. In some examples, the control element may adjust the speed with which to apply the deforming force to the deformable element based at least in part on a direction of the deforming force.

In some examples, the sensor may detect that the viscosity of the fluid is below a predetermined threshold for viscosity and the control element may regulate the speed of the actuator to adjust the optical property at a rate that exceeds five diopters per second in response to the sensor detecting that the viscosity of the fluid is below the predetermined threshold. In some examples, the actuator may adjust the optical property of the adjustable fluid lens by applying the deforming force to the deformable element at the regulated speed such that the fluid to moves at a peak average velocity that is negatively correlated with the viscosity of the fluid.

Additionally or alternatively, the sensor may detect that the viscosity of the fluid is below a predetermined threshold for viscosity and the control element may regulate the speed of the actuator to adjust the optical property at the regulated speed such that the fluid moves at a peak average velocity that exceeds ten millimeters per second in response to the sensor detecting that the viscosity of the fluid is below a predetermined threshold.

In some embodiments, the sensor may detect the property of the fluid that indicates the viscosity of the fluid by measuring a temperature of the fluid and estimating the viscosity of the fluid based at least in part on the temperature of the fluid. Additionally or alternatively, the sensor detects the property of the fluid that indicates the viscosity of the fluid by measuring an ambient temperature of a physical environment surrounding the adjustable fluid lens and estimating the viscosity of the fluid based at least in part on the ambient temperature of the physical environment.

In one embodiment, the adjustable fluid lens may include a substantially transparent substrate and the fluid may be contained between the deformable element and the substantially transparent substrate. In some examples, a ratio of a diameter of the adjustable fluid lens to an average thickness of the fluid may exceed a thirty to one ratio. In some embodiments, the actuator may be coupled to the deformable element and the actuator may adjust the shape of the adjustable fluid lens by applying the deforming force to the deformable element. In some embodiments, the adjustable fluid lens may include a force distributor coupled to the deformable element and the actuator may deform the deformable element into a convex shape by applying the deforming force to the force distributor.

A corresponding system may include a head-mounted device that includes a pair of adjustable fluid lens assemblies, where each of the adjustable fluid lens assemblies includes an adjustable fluid lens that includes a deformable element and a fluid that is substantially transparent and that is contained at least in part by the deformable element, a sensor that detects a property of the fluid that indicates a viscosity of the fluid, a control element that regulates, based at least in part on the property of the fluid, a speed with which to apply a deforming force to the deformable element, and an actuator that adjusts an optical property of the adjustable fluid lens by applying the deforming force to the deformable element at the regulated speed. In some examples, the head-mounted device may communicate with an augmented reality server.

In some embodiments, a method for adjusting fluid lenses may include detecting, by a sensor, a property that indicates a viscosity of a fluid within an adjustable fluid lens, where the fluid is at least partially contained by a deformable element of the adjustable fluid lens, determining, by a control element, based at least in part on the property that indicates the viscosity of the fluid, a speed with which to apply a deforming force to the deformable element, and adjusting, by an actuator, an optical property of the adjustable fluid lens by applying the deforming force to the deformable element at the specified speed.

In some examples, the method may further include detecting, by the sensor, that the viscosity of the fluid has increased, decreasing, by the control element, the specified speed to a new specified speed, and adjusting, by the actuator, the optical property of the adjustable fluid lens by applying the deforming force to the deformable element at the new specified speed. Additionally or alternatively, the method may include detecting, by the sensor, that the viscosity of the fluid has decreased, increasing, by the control element, the specified speed to a new specified speed, and adjusting, by the actuator, the optical property of the adjustable fluid lens by applying the deforming force to the deformable element at the new specified speed.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
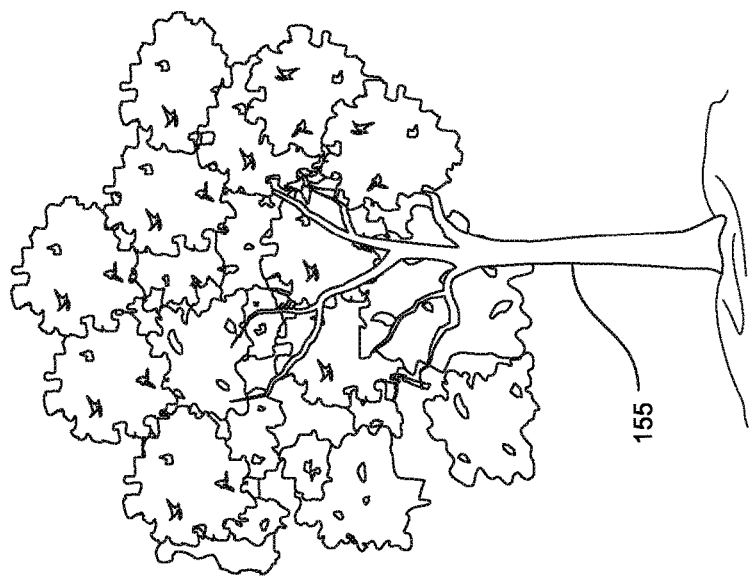
FIG. 1 is an illustration of a user using an assembly containing adjustable lenses to view an object.
Figure 1:
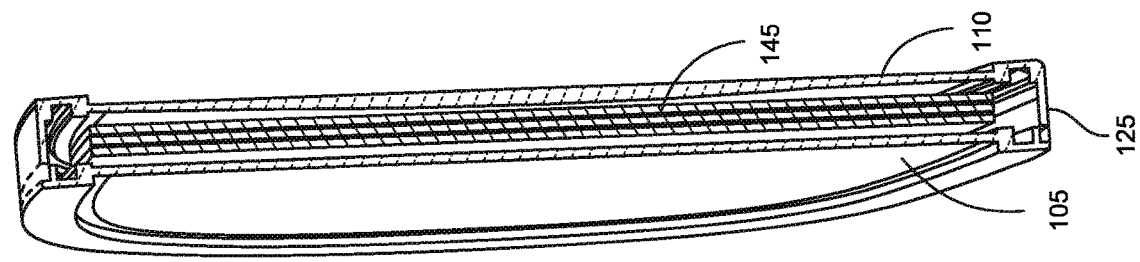
Figure 1:
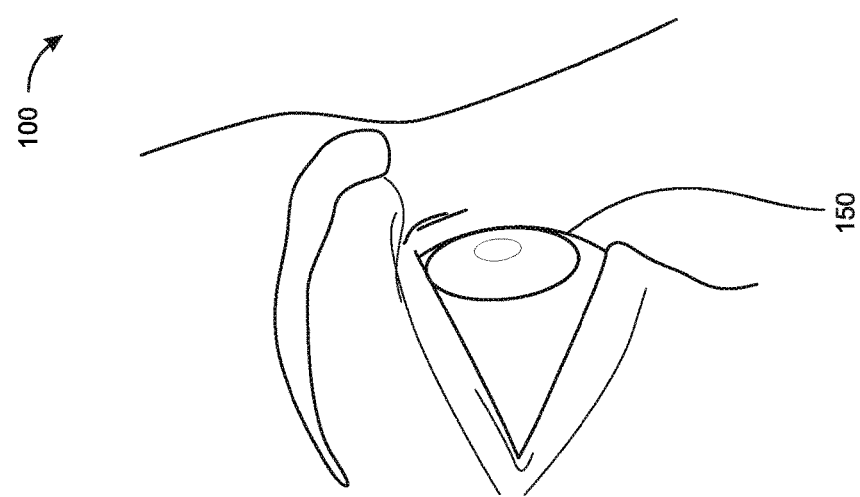

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for adjusting fluid lenses. As will be explained in greater detail below, a sensor that detects a property that indicates a viscosity of the fluid within an adjustable fluid lens may enable a control element to regulate the speed with which to apply a deforming force to a deformable element of the lens such that the time it takes the lens to transition between one state and another and/or visual disruption for a user of the lens during the transition is reduced. The thinner the lens or the stronger the applied deforming force, the higher the velocity of the fluid may be. A higher velocity or viscosity of the fluid may cause a longer response time before the lens reaches equilibrium at the desired optical property, but reducing the speed with which the force applied to the lens may reduce the velocity of the fluid and thus reduce the response time. Reducing the speed with which force is applied to the lens may enable the use of thinner lenses and/or may enable lenses to be used in adverse conditions such as low temperatures without increased response time. In some examples, reducing the adjustment time of the lens may increase the utility of the lens for a wide variety of tasks. In one embodiment, the lens may be part of an augmented reality system and reducing the adjustment time of the lens may improve the immersion, utility, and/or enjoyability of an augmented reality experience by quickly minimizing distortion of real-world images viewed in conjunction with augmented-reality images displayed within a lens assembly that includes the lens. Additionally, reducing the thickness of the lens without reducing response time may enable lenses to be used in more comfortable and/or fashionable frames and/or may enable more lenses to be placed in a frame without increasing the thickness of the frame. Additionally or alternatively, reducing the thickness of the lens may provide room for other elements within a small form factor (e.g., a wearable augmented-reality system).

The following will provide, with reference to FIG. 1, an example lens assembly used for an augmented reality experience and containing one or more fluid lenses. Detailed descriptions of adjustable fluid lenses will be provided in connection with FIGS. 2-4. Detailed descriptions of graphs illustrating fluid height in adjustable fluid lenses will be provided in connection with FIGS. 5-7. Additionally, detailed descriptions of charts illustrating various properties of adjustable fluid lenses will be provided in connection with FIGS. 8, 12, and 13. Detailed descriptions of an example method for adjusting fluid lenses will be provided in connection with FIG. 9. Detailed descriptions of example systems for adjusting fluid lenses will be provided in connection with FIG. 10. Detailed descriptions of an example head-mounted device containing one or more fluid lenses will be provided in connection with FIG. 11. FIG. 1 illustrates a lens-display assembly 100. As shown in FIG. 1, lens-display assembly 100 may include an adjustable lens 105, an adjustable lens 110, and a lens assembly housing 125. In some embodiments, lens-display assembly 100 may include a display 145 positioned between adjustable lenses 105 and 110 that displays augmented reality images. In some examples, the volume between lens assembly housing 125 and display 145 may provide space for actuators that apply force to and/or otherwise adjust the adjustable lenses 105 and 110 (e.g., by applying pressure to force distributors that distribute force to a flexible film of the lens). According to some examples, the combination of adjustable lenses 105 and 110 may modify the apparent accommodation distance of images created by display 145 without changing the appearance of distant real-world objects such as object 155 as perceived by eye 150. In some embodiments, the ratio of the diameter of the adjustable fluid lens 105 and/or 110 to the average thickness of the fluid within lens 105 and/or 110 may exceed a thirty-to-one ratio. In some examples, lens 105 and/or 110 may represent lens 200 illustrated in FIGS. 2-4.

One of the most significant disruptions to having an immersive experience may be a phenomenon known as "vergence-accommodation conflict." Some augmented-reality displays may attempt to create the illusion that a virtual object is set at a distance in the real-world environment by displaying virtual images to the left eye and to the right eye with a relative offset, such that a user's eyes converge on the desired real-world focal point to align the left- and right-side virtual images. At the same time, the user's left and right eyes also undergo accommodation to bring the respective left- and right-side virtual images into focus. However, the distance of the real-world focal point may frequently differ from the distance of the augmented-reality display, causing a difference between the apparent vergence distance and the apparent accommodation distance of a virtual object. Unfortunately, because the human visual system is adapted to the expectation that the apparent vergence distance and the apparent accommodation distance of a real-world object will match, the mismatch frequently posed by traditional augmented reality systems may confuse a user's vision, potentially breaking a sense of immersion—or even causing severe physical discomfort.

Figure 2:
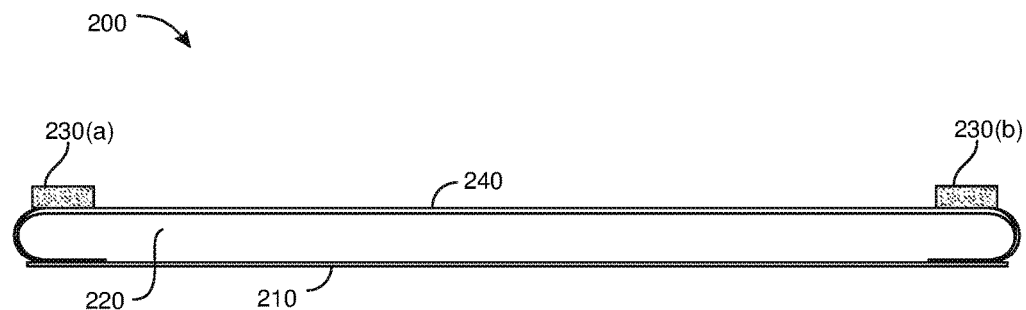
FIG. 2 is a side view of an adjustable lens.

FIG. 2 shows a side view of an adjustable lens 200. As shown in FIG. 2, adjustable lens 200 may include a substrate 210, fluid 220, one or more actuators that include and/or act on force distributors such as force distributors 230(a) and 230(b), and a deformable element such as flexible film 240. Adjustable lens 200 may include any suitable type of fluid lens with adjustable optical properties (e.g., adjustable optical power). In various examples, fluid 220 may be a substantially transparent fluid that is contained at least in part by flexible film 240 and/or substrate 210 and that deforms and/or flows under pressure. In some embodiments, adjustable lens 200 may also include a sensor that detects a property of fluid 220 that indicates a viscosity of fluid 220 and/or a control element that regulates, based at least in part on the property of fluid 220, a speed with which force distributors 230(a) and/or 230(b) apply a deforming force to flexible film 240.

Substrate 210 may be composed of any suitable material. In some examples, substrate 210 may include a rigid material. For example, substrate 210 may be composed of a rigid, substantially transparent polymer. Flexible film 240 may also include any suitable material. For example, flexible film 240 may include a substantially transparent and elastic material. As will be explained in greater detail below, in some examples flexible film 240 may be deformed using one or more force distributors (e.g., force distributors 230(a) and 230(b)) to produce a desired optical power for adjustable lens 200.

In some examples, force distributors 230(a) and 230(b) may be in contact with flexible film 240 and be arranged such that forces applied to force distributors 230(a) and/or 230(b) creates a force over an area of flexible film 240. In some examples, when a force is applied to an area of force distributor 230(a) and/or 230(b), force distributor 230(a) and/or 230(b) may create a force over a larger area of flexible film 240. Forces transmitted by force distributors 230(a) and/or 230(b) may deform adjustable lens 200 into a shape with desired optical properties. In some examples, force distributors 230(a) and 230(b) may represent parts of a single, integral force distributor. In some examples, force distributors 230(a) and 230(b) may represent two sections among a larger number of force distributors arranged on flexible film 240. According to some examples, force distributors 230(a) and 230(b) may form parts of a force distribution ring (whether integral or in sections). In some examples, the force distribution ring may run near the perimeter of flexible film 240. In addition to deforming adjustable lens 200, in some examples force distributors 230(a) and/or 230(b) may maintain tension within flexible film 240.

Adjustable lens 200 may be any suitable shape. For example, adjustable lens 200 may be a circular lens or a non-circular lens. In some examples, adjustable lens 200 may be of a shape substantially similar to eyeglass lens shapes and/or suitable for fitting into a frame similar to eyeglass frames.

In some examples, FIG. 2 may show adjustable lens 200 in a neutral state. For example, as depicted in FIG. 2, adjustable lens 200 may have no substantial optical power. Additionally or alternatively, in some examples, as depicted in FIG. 2, no force may be applied to force distributors 230(a) and 230(b). In some examples, FIG. 2 may illustrate adjustable lens 200 with a threshold amount of force applied to flexible film 240 (e.g., via force distributors 230(a) and 230(b)) to maintain tension within flexible film 240.

In some examples, as used herein, references to "substantial" optical power may refer to an amount of optical power that substantially alters the appearance of an image to a person viewing the image under the optical power. In these examples, references to a lack of substantial optical power (e.g., "substantially no optical power") may refer to an amount of optical power that does not substantially alter the appearance of an image to a person viewing the image under the optical power. In some examples, "substantial" optical power may refer to an amount of optical power that noticeably alters the appearance of an image to a person viewing the image under the optical power, and "substantially no optical power" may refer to an amount of optical power that does not noticeably alter the appearance of an image to a person viewing the image under the optical power. According to various examples, "substantial" optical power may refer to 0.1 or more diopters, 0.15 or more diopters, 0.2 or more diopters, 0.25 or more diopters, 0.3 or more diopters, 0.4 or more diopters, 0.5 or more diopters, or 0.6 or more diopters. Likewise, according to various examples, "substantially no optical power" may refer to less than 0.1 diopters, less than 0.15 diopters, less than 0.2 diopters, less than 0.25 diopters, less than 0.3 diopters, less than 0.4 diopters, less than 0.5 diopters, or less than 0.6 diopters.

Figure 3:
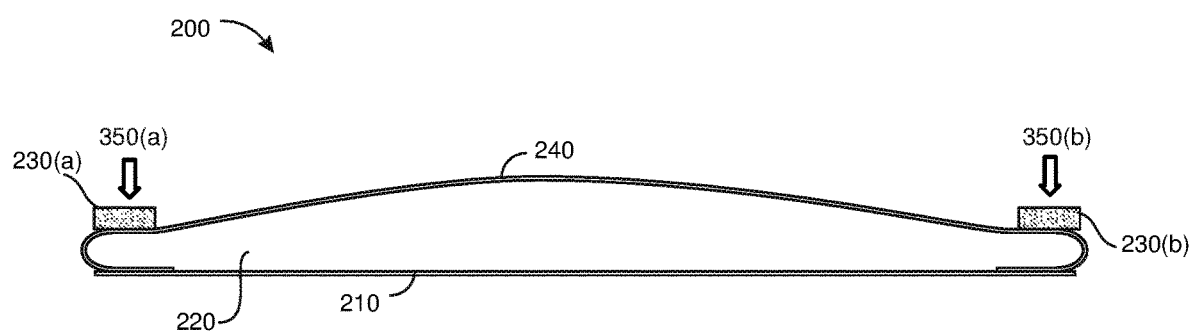
FIG. 3 is a side view of an adjustable lens in an adjusted state.
Figure 4:
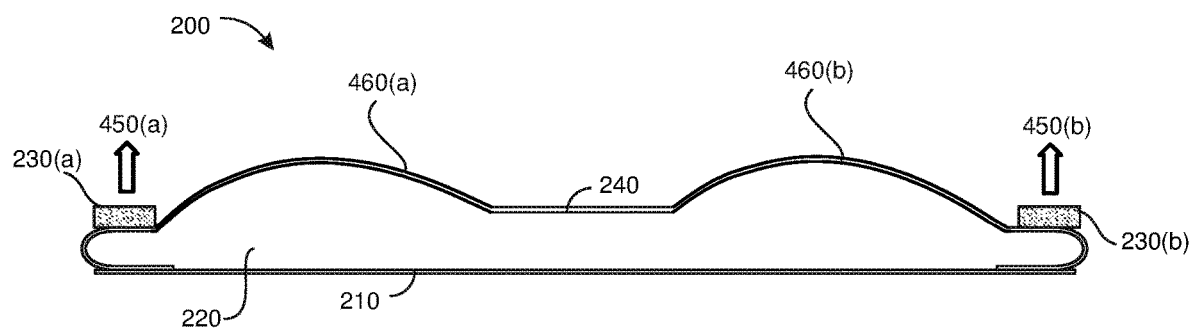
FIG. 4 is a side view of an adjustable lens in another adjusted state.

FIGS. 3 and 4 illustrate adjustable lens 200 in different states. For example, FIG. 3 shows a force 350(a) applied to force distributor 230(a) in the direction of adjustable lens 200 and a force 350(b) applied to force distributor 230(b) in the direction of adjustable lens 200. Force distributors 230(a) and 230(b) compress regions of flexible film 240, causing fluid 220 within adjustable lens 200 to move toward the center of adjustable lens 200. Adjustable lens 200 may thereby create optical power for light transmitted through adjustable lens 200. For example, adjustable lens 200 as shown in FIG. 3 may form a plano-convex lens and exhibit positive optical power.

FIG. 4 shows a force 450(a) applied to force distributor 230(a) away from adjustable lens 200 and a force 450(b) applied to force distributor 230(b) away from adjustable lens 200. Force distributors 230(a) and 230(b) may therefore move away from substrate 210. By moving away from substrate 210, force distributors 230(a) and 230(b) may reduce the pressure of fluid 220 within adjustable lens 200. Adjustable lens 200 may thereby form a plano-concave lens and exhibit negative optical power. In some examples, in the process of transitioning to a plano-concave lens, fluid 220 may form convex protuberances 460(a) and/or 460(b) in flexible film 240. Protuberances 460(a) and 460(b) may hinder adjustable lens 200 from having the desired optical properties. Reducing the amount of time that flexible film 240 and/or fluid 220 spend in this state may enable adjustable lens 200 to transition between neutral or plano-convex and plano-concave states with less disruption for the user of the lens.

Figure 5:
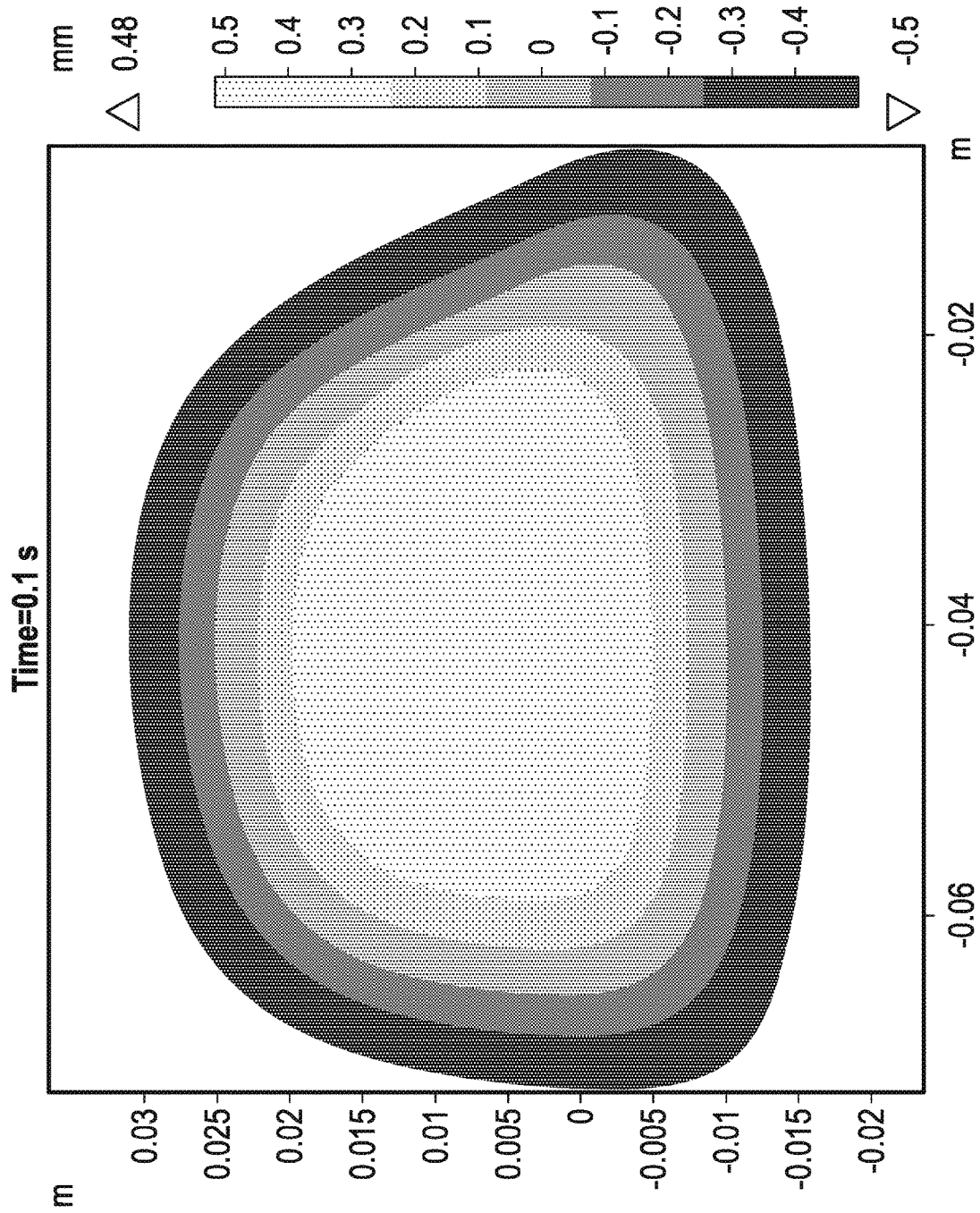
FIG. 5 is a graph of the height of fluid in an adjustable lens.

FIG. 5 shows a graph of the height of a fluid within a plano-convex lens. In a plano-convex lens, the fluid is highest in the center of the lens, tapering off towards the edges of the lens.

Figure 6:
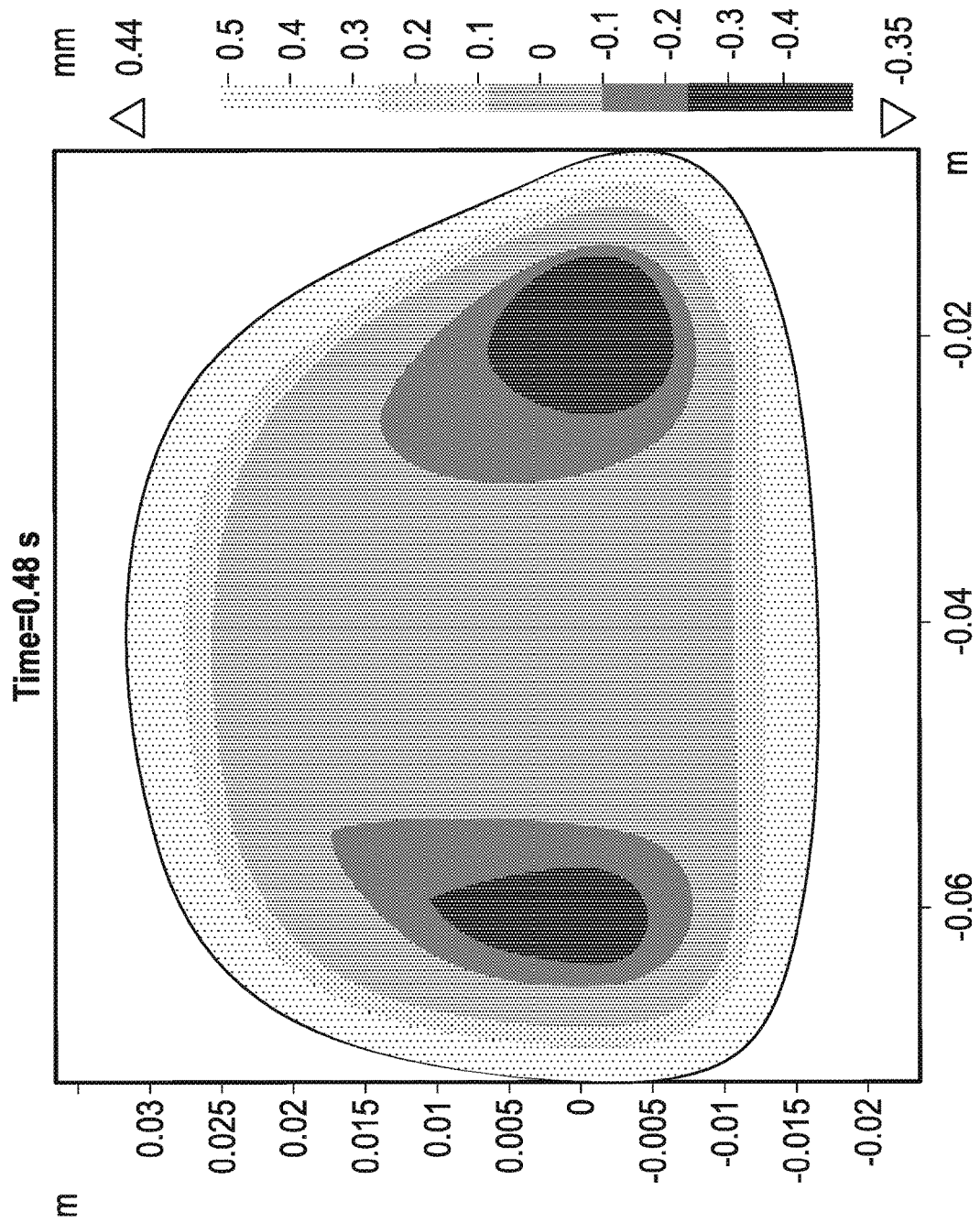
FIG. 6 is a graph of the height of fluid in an adjustable lens transitioning between states.

FIG. 6 shows a graph of the height of a fluid within a lens transitioning to a plano-concave state. During the transition to the plano-concave state, the lens has an uneven height with humps and divots that may disrupt the optical properties of the lens. In some examples, a lens may remain in this disrupted state longer in cold temperatures or other situations where the fluid in the lens has especially high viscosity.

Figure 7:
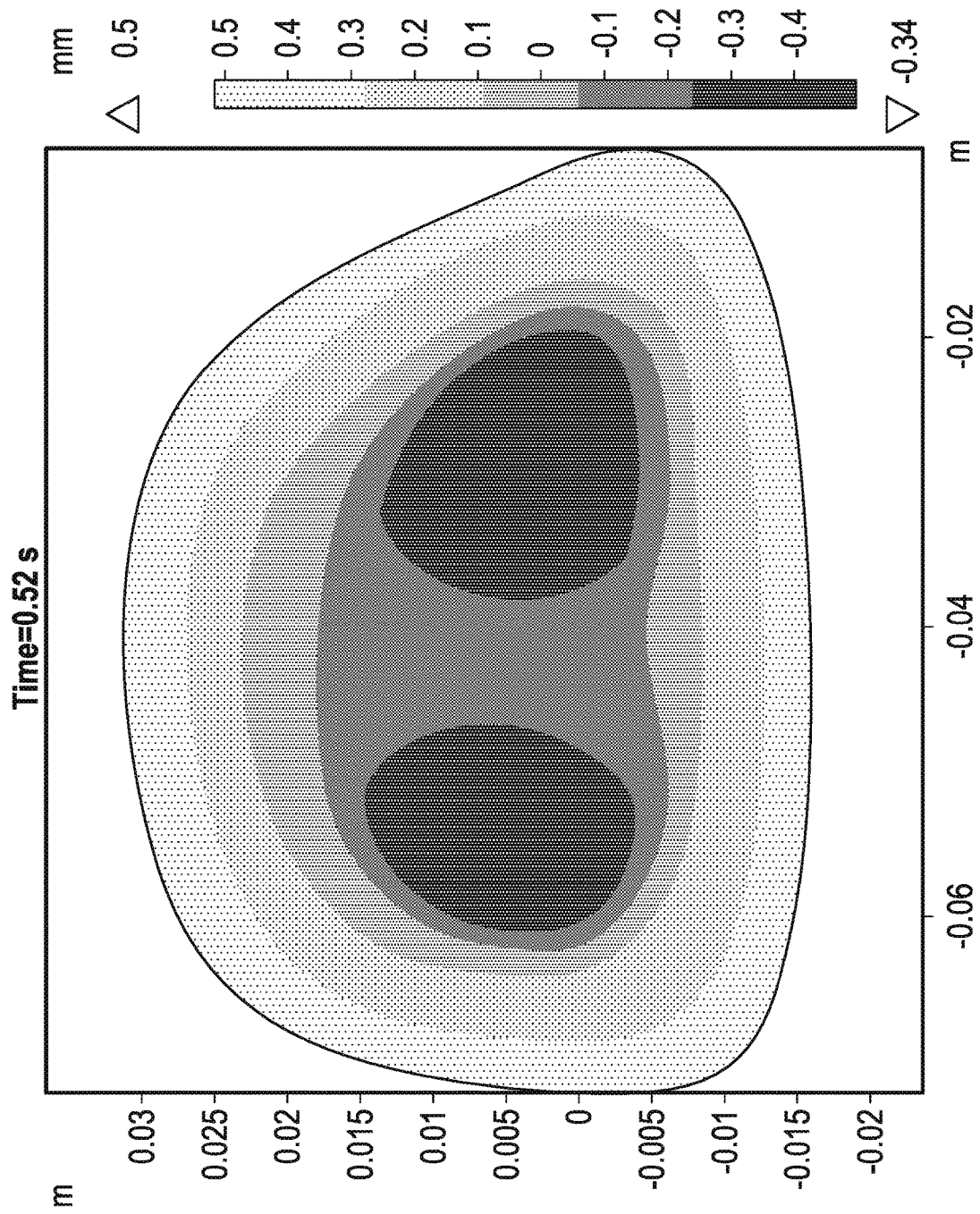
FIG. 7 is a graph of the height of fluid in an adjustable lens in another state.

FIG. 7 shows a graph of the height of a fluid within a lens that has almost completed the transition to a plano-concave state. Though some disruption remains, the lens has almost entirely reached a plano-concave state, with higher fluid height at the edges and lower fluid height in the center. In one example, FIG. 7 may show the state of a lens milliseconds after the state shown in FIG. 6.

Figure 8:
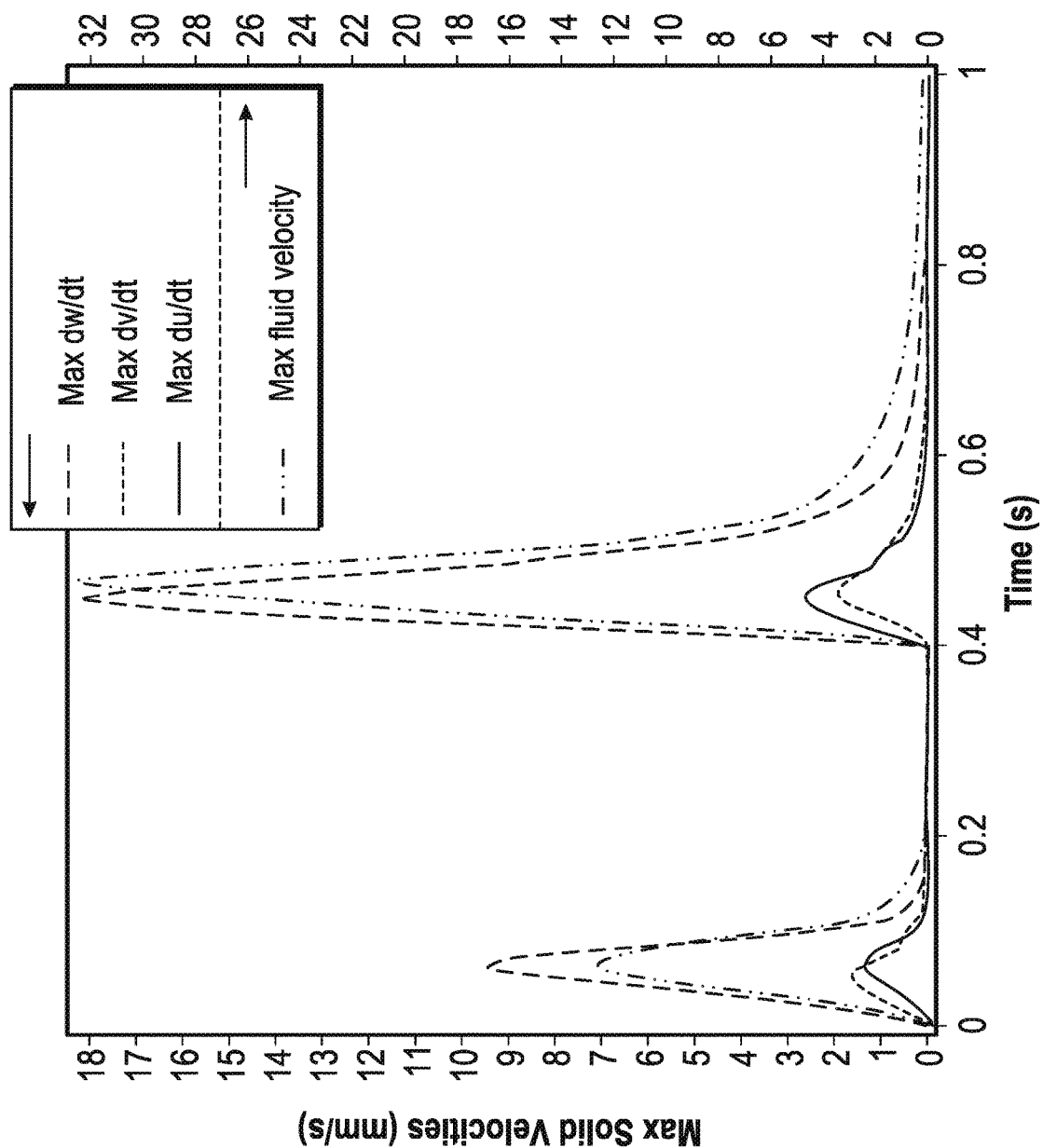
FIG. 8 is a chart of the velocity of solids and fluids in an adjustable lens over time.

FIG. 8 shows a graph of the change in fluid velocity and other properties over time. The first set of peaks in the graph represents a change from a neutral state to a plano-convex state. The second set of peaks in the graph represents a change to a plano-concave state. As shown in the graph, changes that result in a plano-concave state may have a greater peak velocity and/or take longer to return to zero velocity than changes that result in a plano-convex or neutral state. Because of the difference in peak velocity and overall time of changes between different states, the systems described herein may factor the type of state change in to calculations of the force to be applied to the flexible film to trigger a change. For example, the systems described herein may apply less force and/or apply force more slowly during a transition to a plano-concave state in order to reduce the visual disruption caused by transient fluid motion during the transition.

Figure 9:
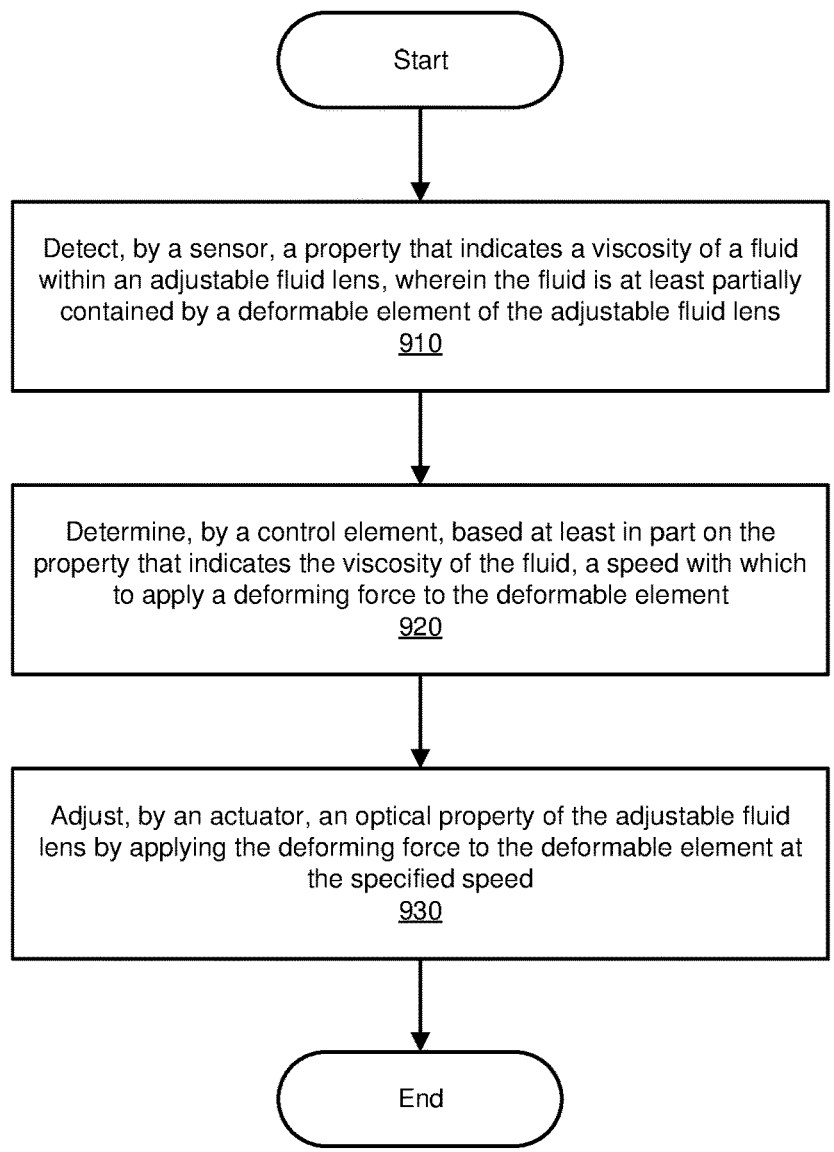
FIG. 9 is a flow diagram of a method for adjusting fluid lenses.

FIG. 9 is a flow diagram of an exemplary computer-implemented method 900 for adjusting fluid lenses. The steps shown in FIG. 9 may be performed by any suitable computer-executable code and/or computing system, including the system illustrated in FIG. 10. In one example, each of the steps shown in FIG. 9 may represent an algorithm whose structure includes and/or is represented by multiple sub-steps, examples of which will be provided in greater detail below.

As illustrated in FIG. 9, at step 910 one or more of the systems described herein may detect, by a sensor, a property that indicates a viscosity of a fluid within an adjustable fluid lens, where the fluid is at least partially contained by a deformable element of the adjustable fluid lens.

In some examples, the term "sensor," as used herein, may refer to any component of an adjustable fluid lens that is capable of detecting one or more properties of the lens and/or the environment surrounding the lens. In some examples, a sensor may be capable of detecting the temperature of the fluid within a fluid lens. Additionally or alternatively, a sensor may be capable of detecting the temperature of the environment surrounding a lens. In some examples, a sensor may be capable of detecting a different property of a fluid lens, such as the current velocity of fluid within the lens.

In some examples, the term "deformable element," as used herein, may refer to any physical element that changes shape in response to force. For example, a deformable element may be a flexible film, such as flexible film 240 in FIGS. 2-4. In some embodiments, a deformable element may be substantially transparent.

The systems described herein may perform step 910 in a variety of ways and/or contexts. In some embodiments, the systems described herein may detect the property in response to a change in the state of the fluid lens being initiated. Additionally or alternatively, the systems described herein may detect the property on a constant basis and/or at regular intervals.

In some examples, the sensor may detect the property of the fluid that indicates the viscosity of the fluid by measuring the temperature of the fluid and estimating the viscosity of the fluid based at least in part on the temperature of the fluid. Additionally or alternatively, the sensor may detect the property of the fluid that indicates the viscosity of the fluid by measuring the ambient temperature of a physical environment surrounding the adjustable fluid lens and estimating the viscosity of the fluid based at least in part on the ambient temperature of the physical environment.

At step 920 one or more of the systems described herein may determine, by a control element, based at least in part on the property that indicates the viscosity of the fluid, a speed with which to apply a deforming force to the deformable element.

In some examples, the term "control element," as used herein, may refer to any component of an adjustable fluid lens that is capable of regulating a speed with which to apply force to an element of the lens. In some embodiments, a control element may include a hardware component. Additionally or alternatively, a control element may include a software component.

The systems described herein may perform step 930 in a variety of ways and/or contexts. In some examples, the control element may regulate the speed according to a positive correlation with the temperature of the fluid. Additionally or alternatively, the control element may adjust the speed with which to apply the deforming force to the deformable element based at least in part on a direction of the deforming force. For example, if the direction of the deforming force is upwards (i.e., pulling the lens into a plano-concave shape as illustrated in FIG. 4), the control element may reduce the speed with which to apply the deforming force in order to reduce the excessive deformation of the fluid illustrated in FIGS. 4 and 6. In some examples, the control element may further reduce the speed with which to apply the force if the temperature is low, due to low temperatures causing higher viscosity in the fluid and exacerbating the excessive deformation problem.

In another example, the control element may increase the speed with which to apply the deforming force if the direction of the force is downwards (i.e., pushing the lens into a plano-convex shape as illustrated in FIG. 3), due to the increased speed with which the lens assumes equilibrium state, as shown in FIG. 8. In one example, if the temperature is high, the control element may increase the speed with which to apply the deforming force due to the lower fluid viscosity caused by the high temperature.

In one embodiment, the sensor may detect that the viscosity of the fluid is below a predetermined threshold for viscosity and, in response, the control element may regulate the speed of the actuator to adjust the optical property (e.g., by applying force to the deformable element) at a rate that exceeds five diopters per second. In other examples, the control element may regulate the speed of the actuator to adjust the optical property at a rate that exceeds four diopters per seconds, six diopters per second, or another suitable rate of adjustment. The systems described herein may facilitate an adjustment of this speed due to low viscosity enabling the fluid within the lens to move more quickly with less transient fluid motion and therefore less resulting visual disturbance during quick transitions. Additionally or alternatively, the sensor may detect that the viscosity of the fluid is below a predetermined threshold for viscosity, and, in response, the control element may regulate the speed of the actuator to adjust the optical property at the regulated speed such that the fluid moves at a peak average velocity that exceeds ten millimeters per second. In another example, the control element may regulate the speed of the actuator to adjust the optical property at the regulated speed such at the fluid moves at a peak average velocity of five millimeters per second, ten millimeters per second, fifteen millimeters per second, or another suitable rate of movement. In some embodiments, the control element may regulate the speed of the actuator in order to hit a predetermined target response time, such as fewer than ten milliseconds, eight milliseconds, five milliseconds, three milliseconds, two milliseconds, or one millisecond. In one embodiment, a target response time may also require that a user perceives no visual distortions during the transition and/or perceives visual distortions for less than a specified amount of time (e.g., one millisecond or half a millisecond). Additionally or alternatively, the control element may regulate the actuator in order to constrain the peak average velocity of the fluid below a certain speed, such as below ten millimeters per second, below five millimeters per second, or below three millimeters per second.

At step 930 one or more of the systems described herein may adjust, by an actuator, an optical property of the adjustable fluid lens by applying the deforming force to the deformable element at the specified speed.

In some examples, the term "optical property," as used herein, may refer to a property of light passing through a lens. In some examples, an optical property of a lens may include the optical power of the lens. For example, an optical power of a lens may be adjusted to offer lesser or greater magnification of an image viewed through the lens.

The systems described here may perform step 930 in a variety of ways. In one example, the actuator may adjust the optical property of the adjustable fluid lens by applying the deforming force to the deformable element at the regulated speed such that the fluid moves at a peak average velocity that is negatively correlated with the viscosity of the fluid. For example, if the fluid has a high viscosity (e.g., due to a low temperature), the actuator may apply the deforming force such that the peak average velocity of the fluid is lower than if the fluid had a lower viscosity (e.g., due to a high temperature) and the actuator applied the deforming force such that the peak average velocity of the fluid was higher.

In some examples, the actuator may apply force at different speeds in different instances in response to the sensor detecting changes in viscosity and/or temperature. For example, the sensor may detect that the viscosity of the fluid has increased compared to some prior measurement, the control element may decrease the specified speed to a new specified speed, and the actuator may adjust the optical property of the adjustable fluid lens by applying the deforming force to the deformable element at the new specified speed. In another example, the sensor may detect that the viscosity of the fluid has decreased compared to some prior measurement, the control element may increase the specified speed to a new specified speed, and the actuator may adjust the optical property of the adjustable fluid lens by applying the deforming force to the deformable element at the new specified speed.

Figure 10:
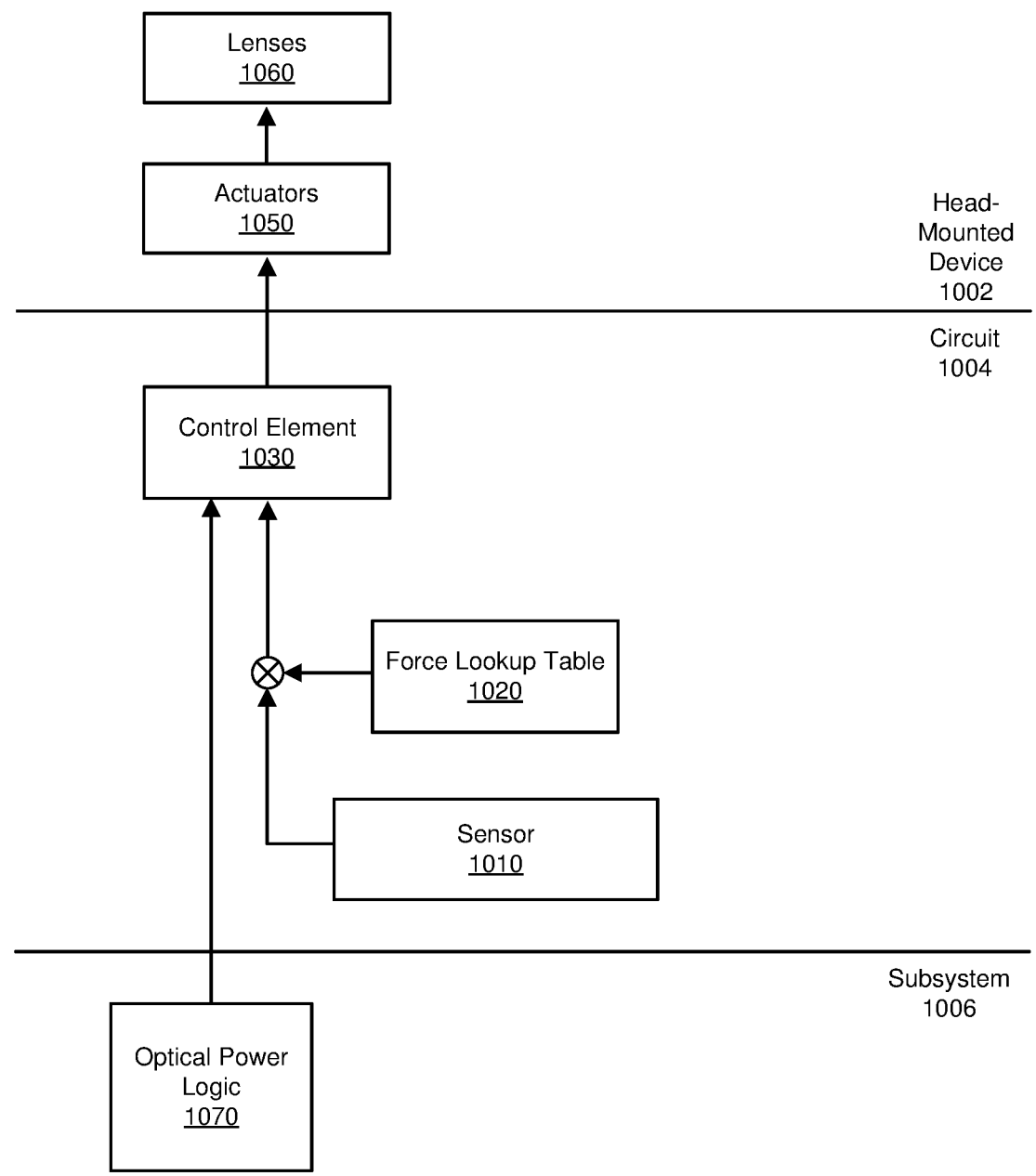
FIG. 10 is a block diagram of a system for adjusting fluid lenses.

FIG. 10 illustrates a system 1000 that adjusts fluid lenses in head-mounted devices. As shown in FIG. 10, system 1000 may include a head-mounted device 1002 and a circuit 1004. Head-mounted device 1002 and circuit 1004 may be communicatively coupled. Additionally, circuit 1004 may be communicatively coupled to a subsystem 1006 that includes optical power logic 1070. A control element 1030 may use a force lookup table 1020, in combination with data from sensor 1010 and/or optical power logic 1070, to determine an amount of force to be applied by actuators 1050 to lenses 1060. Actuators 1050 may, responsive to control element 1030, apply appropriate forces to lenses 1060 to adjust an optical property of lenses 1060 in a way that minimizes extra motion of the fluid within lenses 1060.

Circuit 1004 may represent any suitable circuit for implementing fluid lens adjustment. In some examples, circuit 1004 may represent a system on a chip (SOC). As illustrated in FIG. 10, in some examples control element 1030 and/or force lookup table 1020 may form parts of circuit 1004. In some examples, sensor 1010 may form part of and/or communicate with circuit 1004. In some examples, one or more portions of circuit 1004 may include one or more hardware modules. Additionally or alternatively, one or more portions of circuit 1004 may include one or more software modules that perform one or more of the tasks described herein when stored in the memory of a computing device and executing by a hardware processor of a computing device.

Figure 11:
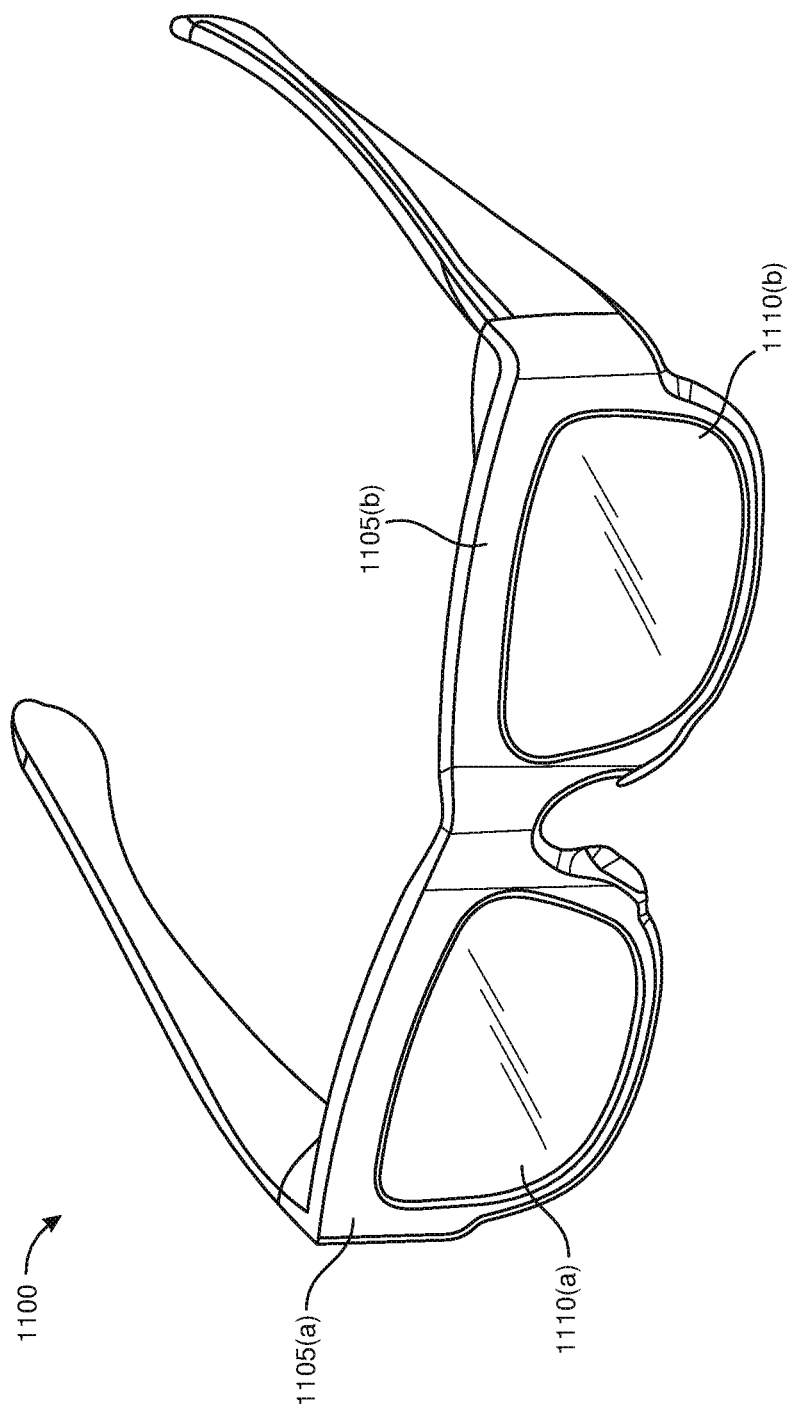
FIG. 11 is an illustration of an example head-mounted device.

FIG. 11 illustrates a head-mounted device 1100. As shown in FIG. 11, head-mounted device 1100 may take the form factor of wearable glasses. A bezel 1105(*a*) may hold a lens-display assembly 1110(*a*) (e.g., corresponding to lens-display assembly 100 and/or containing one or more copies of lens 200) and a bezel 1105(*b*) may hold a lens-display assembly 1110(*b*) (e.g., corresponding to lens-display assembly 100 and/or containing one or more copies of lens 200). In some embodiments, head-mounted device 1100 may be part of an augmented reality system. For example, head-mounted device 1110 may communicate with an augmented reality server to receive images to be displayed on lens-display assemblies 1100.

Figure 12:
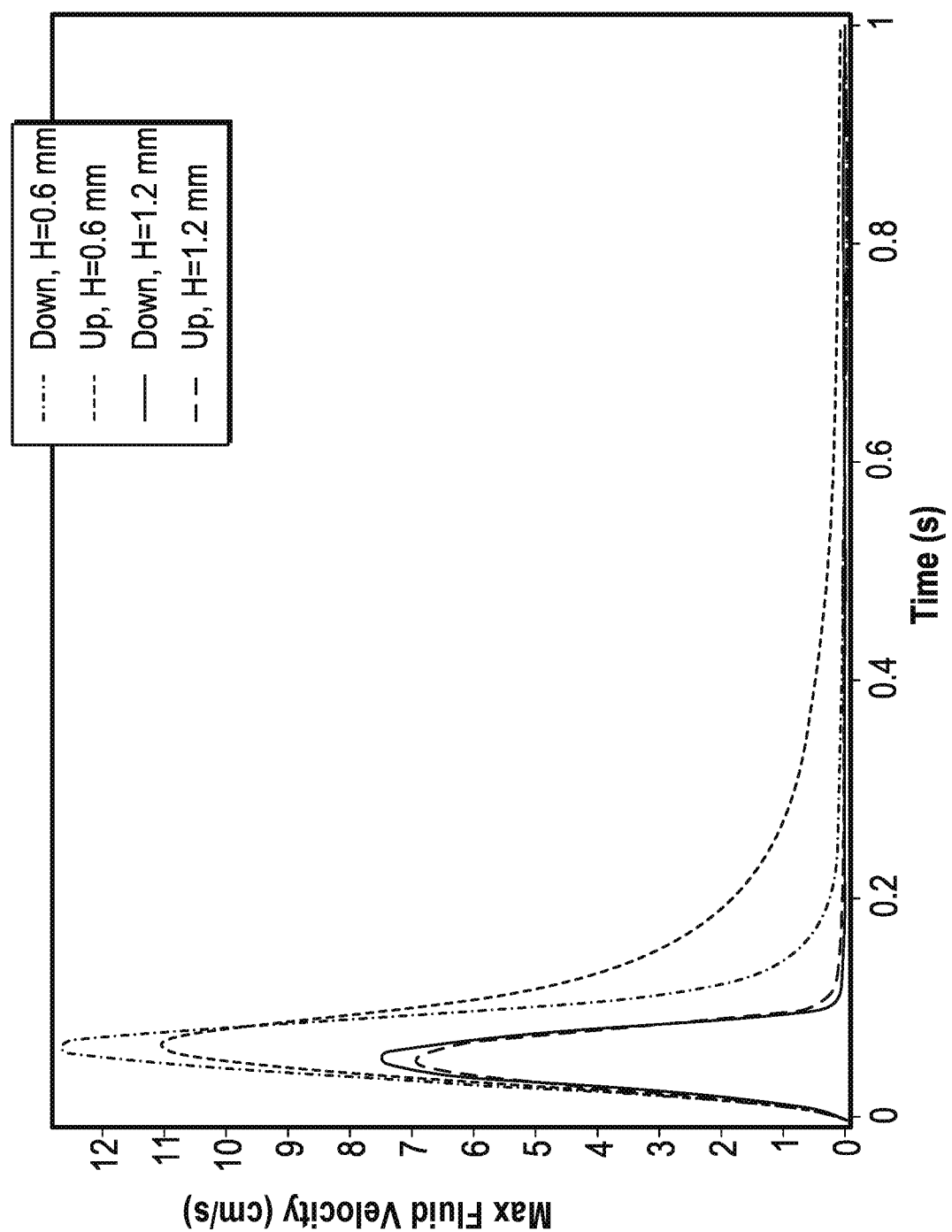
FIG. 12 is a chart of the maximum velocity of fluid in an adjustable fluid lens over time.

FIG. 12 shows a chart of the maximum fluid velocity for different types of movement in fluid lenses with different average fluid thicknesses. As shown in FIG. 12, a lens with a height of 0.6 millimeters reaches a maximum fluid velocity almost twice that of a lens with a height of 1.2 millimeters during both upward (i.e., pulling up on the edge of the lens to form a plano-concave shape) and downward (i.e., pressing down the edge of the lens to form a plano-convex shape) motion of the lens and takes more than twice as long to return to zero velocity (i.e., equilibrium). In some embodiments, the ratio of the diameter of the adjustable fluid lens to the average thickness of the fluid may exceed a thirty-to-one ratio, causing the maximum fluid velocity in the lens during transitions to be much higher than the maximum fluid velocity in a thinner lens. In other examples, the ratio of the diameter to the average thickness of fluid may exceed a twenty-to-one ratio, a twenty-five-to-one ratio, a thirty-five-to-one ratio, or a forty-to-one ratio. In some embodiments, the total thickness of the fluid within a fluid lens may be less than three millimeters, less than two millimeters, less than one millimeter, and/or less than half a millimeter. In some examples, higher fluid velocity may lead to an increase in the extra fluid motion illustrated in FIGS. 4 and 6, meaning that the problems of high viscosity fluid and/or forming plano-concave shapes are exacerbated in a thinner lens. Because of these exacerbated problems, regulating the speed with which force is applied to the flexible film of a lens may be even more important in a thinner lens than a thicker lens in order to reduce excess fluid motion that causes temporary visual impediments to users of lenses.

Figure 13:
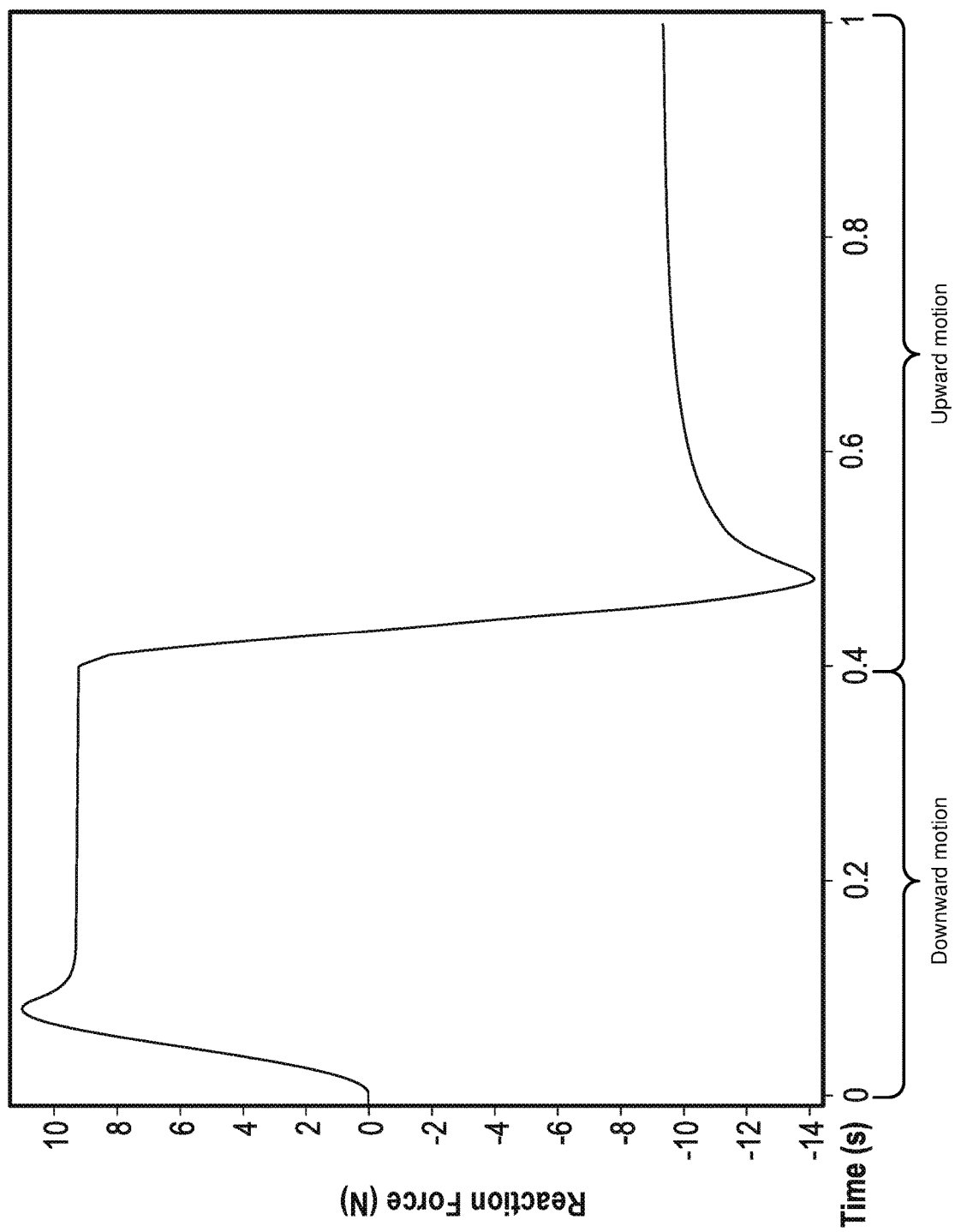
FIG. 13 is a chart of the force applied to an adjustable fluid lens over time.

FIG. 13 shows a chart of the force applied to a lens flexible film first during downward motion (i.e., pressing down the edge of the lens to form a plano-convex shape) and then during upward motion (i.e., pulling up on the edge of the lens to form a plano-concave shape). As shown in the chart, more force is applied during an upward motion. This is due in part to the upward motion occurring after the downward motion and within the same time duration (0.1 seconds) as the downward motion. Hence, to reach equilibrium in the upward motion, the actuator travels twice the distance in the same time duration as during the downward motion, and hence moves twice as fast in the upward motion compared to the downward motion. In addition, as the flexible film approaches the substrate, the thickness of the fluid between the flexible film and the substrate decreases, and the force required to drain additional fluid from between film and substrate increases, extending the time before the flexible film and fluid regain equilibrium. By applying less force during an upward motion, the systems described herein may reduce the peak velocity reached by fluid within the lens and/or the time before the fluid regains equilibrium, reducing temporary visual impairment for the user of the lens and improving the user experience of the lens.

As explained above, the apparatuses, systems, and methods described herein may enable thin fluid lenses to have an improved response times to deformation. When a deforming force is applied to a fluid lens, the fluid within the fluid lens becomes perturbed, and the shape of the fluid lens will not reach its equilibrium form (with the desired optical properties) until the perturbation dissipates. The thinner the lens (or the stronger the applied deforming force) the higher the velocity of the fluid. A higher velocity (or a higher viscosity of the fluid) will cause a longer response time. Furthermore, the thinner the lens, and in particular, the thinner the lens fluid, the higher the force required to move liquid from the center region to the sides during upward motion, leading to longer response times. Furthermore, lower environmental temperatures will raise the viscosity of the fluid, further exacerbating response times, especially for thin lenses. Therefore, in order to achieve a thin fluid lens with a fast response time, a fluid lens adjustment system may detect the temperature and adjust the deforming force applied to the fluid lens accordingly. For example, at lower temperatures, the fluid lens adjustment system may reduce the speed of a driver that applies the deforming force to the fluid lens, thereby compensating for increased viscosity with reduced velocity and preventing a significant increase in response time that may otherwise be caused by the lower temperature.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
 an adjustable fluid lens that comprises:
  a deformable element, and
  a fluid that is substantially transparent and that is contained at least in part by the deformable element;
 a sensor that detects a property of the fluid that indicates a viscosity of the fluid;
 a control element that regulates, based at least in part on the property of the fluid, a speed with which to apply a deforming force to the deformable element, thereby regulating a time taken to transition the adjustable fluid lens between an initial state and a target state; and
 an actuator that adjusts an optical property of the adjustable fluid lens by applying the deforming force to the deformable element at the regulated speed.

2. The apparatus of claim 1, wherein the sensor that detects the property of the fluid detects a temperature of the fluid.

3. The apparatus of claim 2, wherein the control element regulates the speed according to a positive correlation with the temperature of the fluid.

4. The apparatus of claim 1, wherein the actuator that adjusts the optical property of the adjustable fluid lens adjusts an optical power of the adjustable fluid lens.

5. The apparatus of claim 1, wherein the control element adjusts the speed with which to apply the deforming force to the deformable element based at least in part on a direction of the deforming force.

6. The apparatus of claim 1, wherein a ratio of a diameter of the adjustable fluid lens to an average thickness of the fluid exceeds a thirty-to-one ratio.

7. The apparatus of claim 1, wherein:
the sensor detects that the viscosity of the fluid is below a predetermined threshold for viscosity; and
the control element regulates the speed of the actuator to adjust the optical property at a rate that exceeds five diopters per second in response to the sensor detecting that the viscosity of the fluid is below the predetermined threshold.

8. The apparatus of claim 1, wherein the actuator adjusts the optical property of the adjustable fluid lens by applying the deforming force to the deformable element at the regulated speed such that the fluid to moves at a peak average velocity that is negatively correlated with the viscosity of the fluid.

9. The apparatus of claim 1, wherein:
the sensor detects that the viscosity of the fluid is below a predetermined threshold for viscosity; and
the control element regulates the speed of the actuator to adjust the optical property at the regulated speed such that the fluid to moves at a peak average velocity that exceeds ten millimeters per second in response to the sensor detecting that the viscosity of the fluid is below a predetermined threshold.

10. The apparatus of claim 1, wherein the sensor detects the property of the fluid that indicates the viscosity of the fluid by:
measuring a temperature of the fluid; and
estimating the viscosity of the fluid based at least in part on the temperature of the fluid.

11. The apparatus of claim 1, wherein the sensor detects the property of the fluid that indicates the viscosity of the fluid by:
measuring an ambient temperature of a physical environment surrounding the adjustable fluid lens; and
estimating the viscosity of the fluid based at least in part on the ambient temperature of the physical environment.

12. The apparatus of claim 1, wherein:
the adjustable fluid lens comprises a substantially transparent substrate; and
the fluid is contained between the deformable element and the substantially transparent substrate.

13. The apparatus of claim 1, wherein:
the actuator is coupled to the deformable element; and
the actuator adjusts the shape of the adjustable fluid lens by applying the deforming force to the deformable element.

14. The apparatus of claim 1, wherein:
the adjustable fluid lens comprises a force distributor coupled to the deformable element;
the actuator deforms the deformable element into a convex shape by applying the deforming force to the force distributor.

15. A system comprising:
a head-mounted device comprising a pair of adjustable fluid lens assemblies, wherein each of the adjustable fluid lens assemblies comprises:
an adjustable fluid lens that comprises:
a deformable element, and
a fluid that is substantially transparent and that is contained at least in part by the deformable element;
a sensor that detects a property of the fluid that indicates a viscosity of the fluid;
a control element that regulates, based at least in part on the property of the fluid, a speed with which to apply a deforming force to the deformable element, thereby regulating a time taken to transition the adjustable fluid lens between an initial state and a target state; and
an actuator that adjusts an optical property of the adjustable fluid lens by applying the deforming force to the deformable element at the regulated speed.

16. The system of claim 15, wherein the sensor that detects the property of the fluid detects a temperature of the fluid.

17. The system of claim 15, wherein the head-mounted device communicates with an augmented reality server.

18. A method comprising:
detecting, by a sensor, a property that indicates a viscosity of a fluid within an adjustable fluid lens, wherein the fluid is at least partially contained by a deformable element of the adjustable fluid lens;
determining, by a control element, based at least in part on the property that indicates the viscosity of the fluid, a speed with which to apply a deforming force to the deformable element, thereby regulating a time taken to transition the adjustable fluid lens between an initial state and a target state; and
adjusting, by an actuator, an optical property of the adjustable fluid lens by applying the deforming force to the deformable element at the determined speed.

19. The method of claim 18, further comprising:
detecting, by the sensor, that the viscosity of the fluid has increased;
decreasing, by the control element, the specified speed to a new specified speed; and
adjusting, by the actuator, the optical property of the adjustable fluid lens by applying the deforming force to the deformable element at the new specified speed.

20. The method of claim 18, further comprising:
detecting, by the sensor, that the viscosity of the fluid has decreased;
increasing, by the control element, the specified speed to a new specified speed; and
adjusting, by the actuator, the optical property of the adjustable fluid lens by applying the deforming force to the deformable element at the new specified speed.

* * * * *

UNITED STATES PATENT AND TRADEMARK OFFICE
CERTIFICATE OF CORRECTION

PATENT NO. : 10,754,145 B1
APPLICATION NO. : 16/008635
DATED : August 25, 2020
INVENTOR(S) : Andrew J. Ouderkirk et al.

Page 1 of 1

It is certified that error appears in the above-identified patent and that said Letters Patent is hereby corrected as shown below:

On the Title Page

In Column 1, item (72), Inventors, Line 8, delete "Farmingham" and insert -- Framingham --, therefor.

In Column 2, item (56), Other Publications, Line 4, delete "BaTi03" and insert -- BaTiO3 --, therefor.

Signed and Sealed this
Thirteenth Day of October, 2020

Andrei Iancu
*Director of the United States Patent and Trademark Office*